United States Patent [19]
Ohji et al.

[11] Patent Number: 4,907,046
[45] Date of Patent: Mar. 6, 1990

[54] SEMICONDUCTOR DEVICE WITH MULTILAYER SILICON OXIDE SILICON NITRIDE DIELECTRIC

[75] Inventors: Yuzuru Ohji; Osamu Kasahara, both of Nishitama; Yoshitaka Tadaki, Ome; Hiroko Kaneko, Higashimurayama; Toshiyuki Mine; Kunihiro Yagi, both of Nishitama, all of Japan

[73] Assignee: Hitachi Ltd., Tokyo, Japan

[21] Appl. No.: 168,490

[22] Filed: Mar. 15, 1988

[30] Foreign Application Priority Data

Mar. 20, 1987 [JP] Japan .................................. 62-63765

[51] Int. Cl.[4] ...................... H01L 29/78; H01L 27/02; H01L 29/34
[52] U.S. Cl. ...................................... 357/23.6; 357/51; 357/54
[58] Field of Search ............................ 357/51, 54, 23.6

[56] References Cited

U.S. PATENT DOCUMENTS

| | | | |
|---|---|---|---|
| 4,151,607 | 4/1979 | Koyanagi et al. | 365/174 |
| 4,505,026 | 3/1985 | Bohr et al. | 29/577 |
| 4,536,947 | 8/1985 | Bohr et al. | 357/54 |
| 4,768,080 | 8/1988 | Sato | 357/54 |
| 4,805,147 | 2/1989 | Yamanaka et al. | 357/23.6 |

FOREIGN PATENT DOCUMENTS 61-85857  7/1986  Japan .

OTHER PUBLICATIONS

Characterization of Thermally Oxidized n+ Polycrystalline Silicon, by Faraone, et al., IEEE Transactions on Electron Devices, vol. ED-32, No. 3, Mar. 1985, pp. 577-583.

Primary Examiner—Eugene R. LaRoche
Assistant Examiner—Michael Shingleton
Attorney, Agent, or Firm—Fay, Sharpe, Beall, Fagan, Minnich & McKee

[57] ABSTRACT

A solid state device includes a transistor (A) and a capacitor (B). The capacitor is defined by a lower polycrystalline silicon layer or electrode (20), multiple dielectric layers (22), and an upper polycrystalline silicon layer or electrode (30). The dielectric layers are formed by vapor depositing a 3.6–18.6 nm thick layer of silicon nitride on the lower polycrystalline layer. Thicker silicon nitride layers increase the failure rate and decrease the capacitance (FIG. 8). More specifically, the silicon nitride layer is deposited on a thin, about 1 nm, oxidized film or surface (24) of the polycrystalline silicon layer. The silicon nitride layer is oxidized forming a silicon dioxide layer (28) until the silicon nitride layer is only about 3 nm thick. This forms on oxide layer that is 1–8.4 nm thick. If the silicon nitride layer is reduced below 3 nm, the polycrystalline silicon tends to oxidize rapidly reducing capacitance and increasing failure (FIG. 8).

10 Claims, 7 Drawing Sheets

SEMICONDUCTOR DEVICE WITH MULTILAYER SILICON OXIDE SILICON NITRIDE DIELECTRIC

BACKGROUND OF THE INVENTION

The present invention relates to the art of semiconductor devices. It finds particular application in capacitive elements of extremely high integration density semiconductor chips and will be described with particular reference thereto. It is to be appreciated, however, the invention may also find application in conjunction with other semiconductor devices which incorporate dielectric insulators.

Heretofore, semiconductor memory devices have incorporated an integral storage capacitance construction. The capacitance construction normally included a pair of polycrystalline electrodes separated by a dielectric layer. Most commonly, the dielectric layer was a layer of silicon dioxide. In fabrication, the lower polycrystalline electrode was oxidized at an elevated temperature, e.g. 900° C., to form the silicon dioxide insulating layer. The upper polycrystalline silicon electrode was deposited on the oxidized surface of the lower polycrystalline electrode. Although thermal oxidation is an effective technique for monocrystalline silicon, the high temperature oxidation of polycrystalline silicon creates problems. Thermally oxidized polycrystalline silicon commonly has a greater leakage current, a lower breakdown voltage, and more initial defects than thermally oxidized monocrystalline silicon.

Besides silicon dioxide, it has been suggested that other high permittivity dielectrid films, such as silicon nitride, tantalum oxide, or multiple layers of these films, could be utilized. See for example U.S. Pat. No. 4,151,607 to Koyanagi et al. issued Apr. 24, 1979 and U.S. Pat. No. 4,505,026 to Bohr et al. issued Mar. 19, 1985.

Japanese Patent Application No. 61-85857 to Kita, laid open May 1, 1986 discloses a multi-layered insulation construction. A 100 nm layer of polycrystalline silicon is low pressure chemically vapor deposited. A 20 nm layer of silicon nitride is low pressure chemically vapor deposited on the polycrystalline silicon layer. After etching, the silicon nitride layer is thermally oxidized to form a 2 nm layer of silicon dioxide. A polycrystalline silicon electrode layer was deposited on the silicon dioxide.

Neither these nor other multilayered insulation films proposed for capacitor insulation have proven satisfactory for capacitor insulation film. The proposed multilayered insulation films failed to achieve optimal capacitance characteristics, low leakage current, low defect occurrence, high reliability, high capacitance, and the like. Thick silicon nitride layers, such as a 20 nm layer, are more apt to fail and have a lower capacitance than thinner layers, particularly layers under 12 nm.

In accordance with the present invention, there is provided a new and improved dielectric insulation film which overcomes the above-referenced problems and others.

SUMMARY OF THE INVENTION

In accordance with a first aspect of the present invention, a method of manufacturing a solid state device is provided. A layer of polycrystalline silicon is formed and a thin oxide film is formed on the crystalline silicon layer. A layer of a silicon-nitrogen composition is formed on the oxide film. The silicon-nitrogen composition layer is less than 18.6 nm thick. An exposed surface of the silicon-nitrogen layer is oxidized such that at least 3 nm of the silicon-nitrogen composition remains unoxidized adjacent the oxide film to protect the polycrystalline silicon layer from further oxidation. An electrode layer is formed on the oxygen silicon-nitrogen layer.

In accordance with another aspect of the present invention, an improvement is provided for a method of manufacturing a solid state device. A silicon oxide film is formed on a substrate. A silicon nitride layer is formed on the oxide film and a portion of it is oxidized to form a silicon oxide layer. In the improvement, the silicon nitride layer is formed with a thickness that is greater than $$3 \text{ nm} + \left(\frac{1}{1.6}\right) t_{SiO}$$

and which is less than $$(12 \text{ nm} - t_o)\frac{E_{SiN}}{E_{SiO}} - \left(\frac{E_{SiN}}{E_{SiO}} - \frac{1}{1.6}\right) t_{SiO},$$

$t_{SiO}$, where $t_{SiO}$ is a thickness of the silicon oxide layer, $t_o$ is a thickness of the oxide film, $E_{SiN}$ is a dielectric constant of the silicon nitride, and $E_{SiO}$ is a dielectric constant of the silicon oxide.

In accordance with another aspect of the present invention, a capacitor is integrally constructed with a semiconductor device. The capacitor includes a lower electrode having a layer of polycrystalline silicon with a thin oxidized film on a first surface. A multilayered dielectric includes a layer of silicon nitride disposed on the xide* film and a layer of silicon oxide disposed on the silicon-nitride film. The silicon-nitride layer is between 3 nm and 18 nm thick and the silicon-oxide layer is between 1 nm and 8½ nm thick. An upper electrode is mounted to the multilayer dielectric.

In accordance with yet another aspect of the present invention, a solid state device is provided. A polycrystalline silicon layer has an oxide film on one surface thereof. A first dielectric layer which includes silicon-nitrogen composition is disposed adjacent the oxide film. A second dielectric layer including a silicon-oxygen composition is disposed adjacent the first dielectric layer. The first dielectric layer has a thickness which is greater than $$3 \text{ nm} + \left(\frac{1}{1.6}\right) t_2,$$

and less than $$(12 \text{ nm} - t_o)\frac{E_{SiN}}{E_{SiO}} - \left(\frac{E_{SiN}}{E_{SiO}} - \frac{1}{1.6}\right) t_2,$$

where $t_2$ is a thickness of the second dielectric layer, $t_o$ is a thickness of the oxide film, $E_{SiN}$ is a dielectric constant of the silicon-nitrogen composition, and $E_{SiO}$ is a dielectric constant of the siliconoxygen composition.

One of the advantages of the present invention resides in its high reliability as a dielectric used in conjunction with polycrystalline silicon.

Another advantage of the present invention resides in a low incidence of defects.

Further advantages of the present invention include a low leakage current, a relatively high capacitance, and simplicity of manufacture.

Still further advantages of the present invention will become apparent to those of ordinary skill in the art upon reading and understanding the following detailed description of the deferred embodiments.

BRIEF DESCRIPTION OF THE DRAWINGS

The invention may take form in various steps and arrangements of steps in various components and arrangements of components. The drawings are only for purposes of illustrating a preferred embodiment and are not to be construed as limiting of the invention.

DETAILED DESCRIPTION OF THE PREFERRED EMBODIMENTS

Embodiment 1

Figure 1:
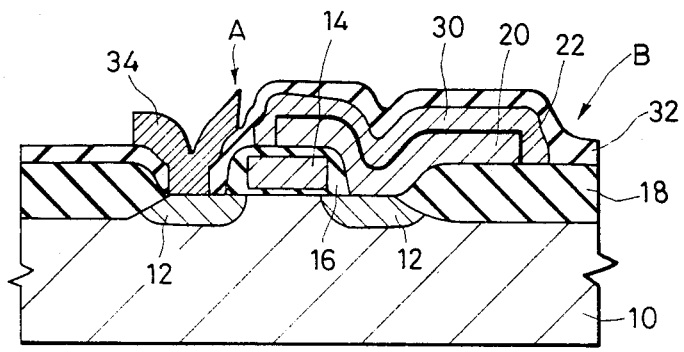
FIG. 1 is a schematic, sectional view of a dynamic random access memory cell incorporating a capacitance with a multilayered insulation film in accordance with the present invention.

With reference to FIG. 1, a dynamic random access memory includes a MOS transistor A and a capacitor B connected to one of the terminals of the transistor. The dynamic random access memory includes a doped substrate 10 in which regions 12 are doped with an n-type impurity in a high concentration. A n-type silicon region 14 which forms the gate of the MOS transistor is surrounded by an insulation film 16. A thick silicon dioxide film 18 is mounted on the substrate 10 for isolation.

Figure 2:
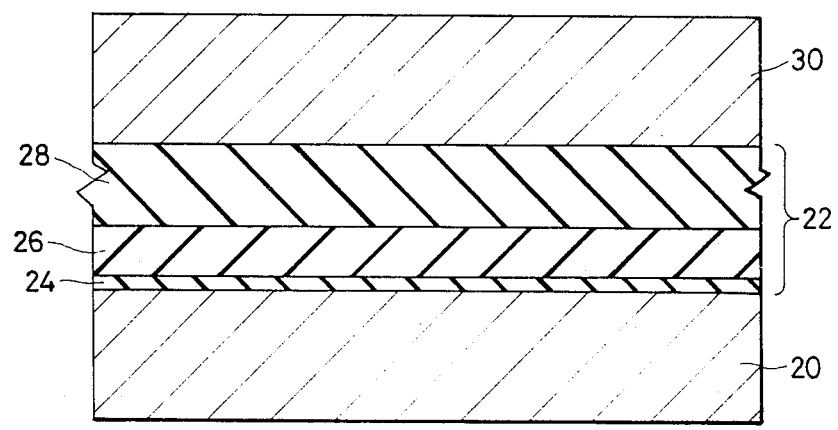
FIG. 2 is an enlarged, sectional view illustrating the multilayered insulation film of FIG. 1.

WIth continuing reference to FIG. 1 and further reference to FIG. 2, the capacitor B includes a lower layer or electrode 20 of polycrystalline silicon. The lower layer of electrode is connected with one of the n-type impurity doped regions 12 of the transistor A. A multilayer dielectric insulation layer 22 includes a silicon dioxide, $SiO_2$, film 24 which is oxidized from the polycrystalline layer 20 during fabrication. A silicon nitride, $Si_3N_4$ or first dielectric, layer 26 is disposed on the oxide film 24. A silicon dioxide or second dielectric layer 28 is disposed between the silicon nitride layer 26 and an upper electrode 30, preferably another polycrystalline silicon layer.

An insulator layer 32 covers the capacitor B insulating the capacitor and the gate of the transistor from an aluminium electrode 34. The aluminium electrode 34 is connected with the other of the n-type impurity doped regions 12.

Figure 3:
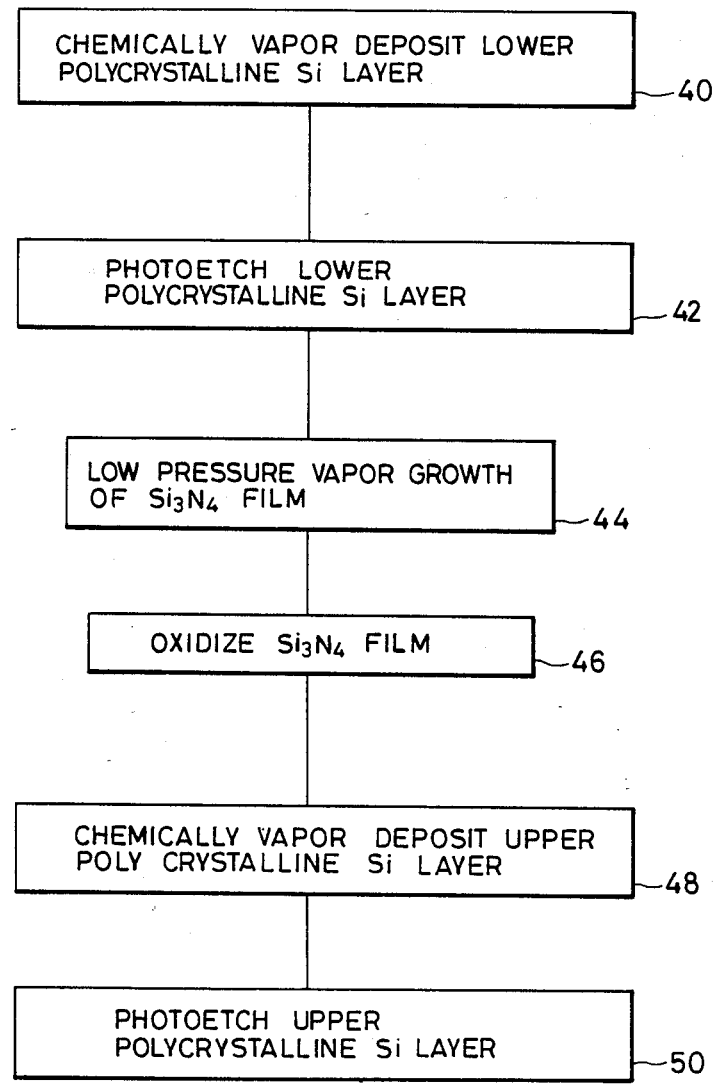
FIG. 3 is a diagramatic illustration of a method of fabricating at least the capacitive portion of the solid state device at FIG. 1.

With containing reference to FIG. 2 and further reference to FIG. 3, the lower polycrystalline silicon layer or electrode 20 is formed by a chemical vapor deposition (CVD) step 40. The polycrystalline silicon layer is photoetched in a photoetching step 42 to define the shape of the lower polycrystalline silicon layer.

After laying and etching the polycrystalline silicon layer, the silicon nitride layer 26 is laid on the exposed, oxidized surface. More specifically, the silicon nitride is deposited in a low pressure chemical vapor deposition step 44 on the exposed, oxidized surface at the lower polycrystalline electrode 20. Preferably, an 8 nm thick film of silicon nitride is deposited. However, 3.6–18.6 nm thick silicon nitride film have also been found to be acceptable.

The oxide film 24 starts forming in the photoetching step during the water rinse. Further oxidation occurs as the polycrystalline layer is placed in the furnace for the low pressure chemical vapor depostion step. These steps are controlled to minimize the thickness of the natural oxide layer, preferably holding it to 1 nm or less.

The silicon nitride film 26 is oxidized in an oxidizing step 46 to form the silicon oxide film of the second dielectric layer 28. Preferably, the silicon nitride film is oxidized in a water vapor atmosphere at 900° C. to form a silicon dioxide layer that is at least 1 nm thick. The oxidizing is limited such that about 3 nm or more of the silicon nitride film remain adjacent the lower electrode 20 to protect it from further oxidation. The silicon nitride depositing and oxydizing steps are conducted such that the oxide film, the unoxidized silicon nitride layer, and the silicon oxide layer have an effective thickness that is equal to or less than 12 nm. In the preferred embodiment in which the applied silicon nitride film was 8 nm thick, about 5 nm are oxidized to silicon dioxide. Oxidation of silicon nitride to silicon oxide increases the thickness by a factor of 1.6. Thus, oxidizing 5 nm of silicon nitride produces a silicon dioxide layer which is about 8 nm thick.

After the silicon nitride has been oxidized to form the upper silicon dioxide film 28, the upper polycrystalline silicon electrode 30 is laid. The layer of polycrystalline silicon is chemically vapor deposted in a deposition step 48 and photoetched in a photoetching sep to a preselected shape. In the above-described preferred embodiment, the resulting charge storage of the capacitance is 3.98 fF/$\mu m^2$ (3.98×10$^{-3}$ F/$m^2$), when the inherent silicon oxide film 24 is about 1 nm.

Figure 4:
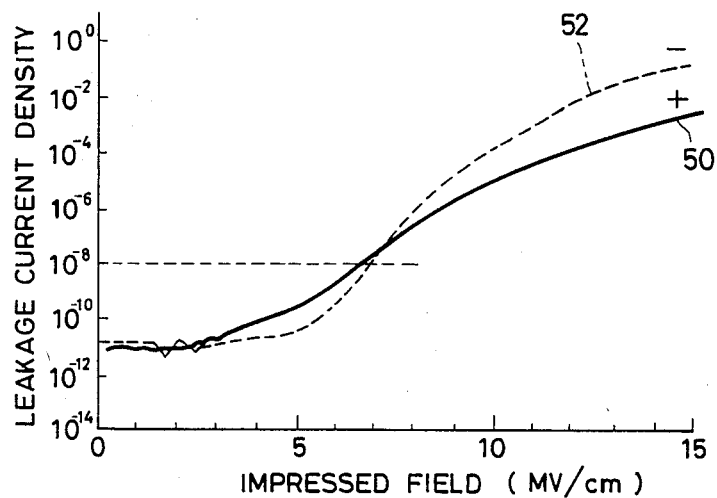
FIG. 4 is a diagram illustrating leakage current versus increased voltage characteristics of the capacitor described in FIG. 1.

With reference to FIG. 4, curve 50 illustrates the leakage amount density versus breakdown voltage with the upper electrode biased with a positive polarity. A breakdown occurs at 6.5 MV/cm (5.5 V) against a maximum leakage current of $10^{-8}$ A/cm$^2$, the preferred current for securing a refresh time cycle of the dynamic random access memory. When the upper electrode is biased with a negative polarity illustrated in curve 52, the breakdown voltage is at 6.8 MV/cm (5.8 V). If the thickness of the thermal oxidation layer 28 is increased to 8.0 nm, the breakdown voltage becomes 5 MV/cm. In this embodiment, the time dependent dielectric breakdown life is extrapolated to $2 \times 10^{13}$ seconds with a voltage of 2.5 volts. The defect density is below 0.05 pieces per square centimeter. This produces a yield of about 99% in a 4 megabyte dynamic random access memories.

Figure 5:
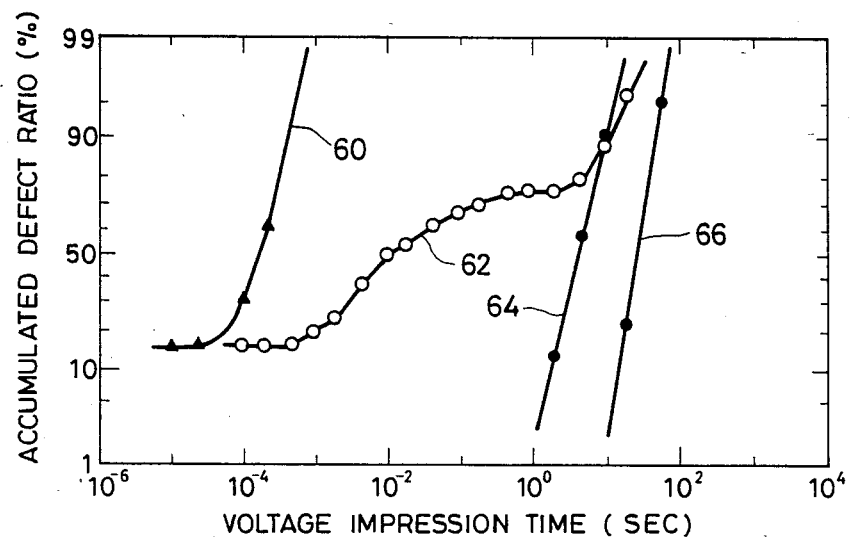
FIG. 5 is a diagramatic illustration of relative time dependent dielectric breakdown (TDDB) characteristics of thermal oxidation, a silicon nitride, and silicon nitride/silicon oxide two-layered films.

WIth reference to FIG. 5; curve 60 illustrates the relationship between the accumulated defect ratio and the time dependent dielectric breakdown characteristics for a 10 nm thermaly grown silicon dioxide of polycrystalline silicon surface. The extremely short dielectric breakdown life is due to defective quality portions, i.e. latent defects, that scatter locally in the film. Curve 62 illustrates the accumulated defect ratio versus time dependent dielectric breakdown life when a silicon nitride layer 8 nm thick is formed upon the polysilicon electrode. Because the latent defects are fewer in the nitride layer than in the thermal oxidation layer, the life expectancy becomes longer. However, the width or variation in life expectancy distribution varies widely from 5 to 6 digits. Accordingly, when applied to a 4 megabyte dynamic random access memory, for example, the silicon nitride layer lacks a consistently predictable life expectancy.

Curve 64 illustrates the relationship between the accumulated defect ratio and the time dependent dielectric breakdown for a two-layered dielectric in which the upper surface of the silicon nitride layer is oxidized to produce a 1 nm layer of silicon dioxide leaving an 8 nm layer of silicon nitride.

Oxidizing the silicon nitride in a water vapor atmosphere of 900° C. substantially reduces the latent defects and narrows the range of life expectancy to about 1 digit. Curve 66 illustrates the accumulated defect ratio to time dependent dielectric breakdown for a two-layered insulator having 1 nm of silicon oxide and a 8 nm of silicon nitride with the polarity reversed. Thus, the life expectancy is longer and more predictable with an oxide layer of 1 nm. That is, in curve 66 a positive bias of 14 MV/cm is applied whereas in curves 60, 62, and 64 a bias voltage of −12 MV/cm was applied. Analogous results can be obtained when the silicon nitride layer is oxidized to depths greater than 1 nm.

Figure 6:
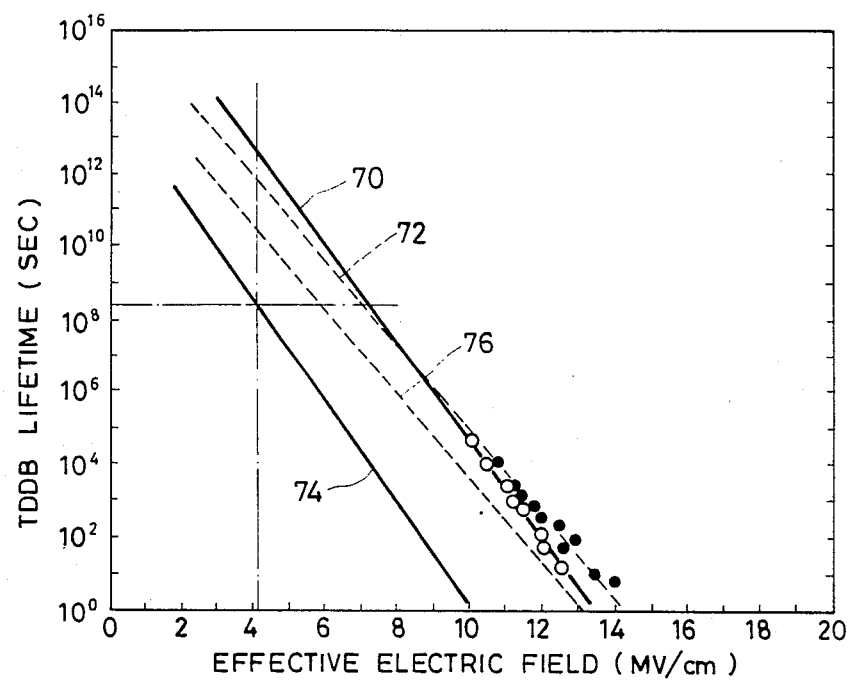
FIG. 6 is a diagramatic illustration of time dependent dielectric breakdown (TDDB) life versus effective electric field for 9 nm layers of silicon nitride and silicon nitride/silicon oxide layers with a 0.1% cumulative failure and for defect-free films.

With reference to FIG. 6, curve 70 illustrates the time dependent dielectric breakdown time versus effective electric field for a perfect, defect-free 9 nm silicon nitride layer, i.e. the intrinsic breakdown characteristics. Curve 62 illustrates the intrinsic breakdown characteristics for a double insulator layer in which there is 1 nm of silicon dioxide and 8 nm of silicon nitride. Curve 74 illustrates the breakdown characteristics for the 9 nm silicon nitride film when it has an 0.1% cumulative failure rate. Curve 76 illustrates the breakdown characteristics of the double layer film which has 1 nm of silicon dioxide and 8 nm of silicon nitride with the 0.1% cumulative failure rate. With an effective electrical field of 4.2 MV/cm or less, each thick layer of silicon oxide produces an acceptable life expectancy.

Figure 7:
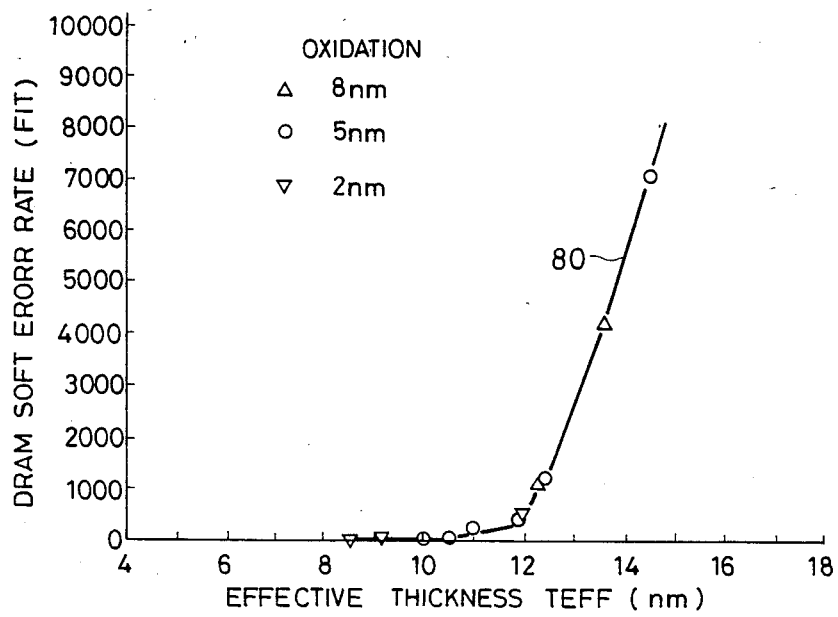
FIG. 7 illustrates the relationship between the error or failure rate and the effective thickness of the dielectric for 2, 5, and 8 nm layers of silicon dioxide.

With reference to FIG. 7, curve 80 illustrates failure rate versus effective thickness of the oxide film, the silicon nitride layer, and the silicon dioxide layer taken together. Data taken the oxide layer ranging from 2 through 8 nm are confirmed that the failure rate makes a dramatic increase at an effective thickness of about 12 nm.

Figure 8:
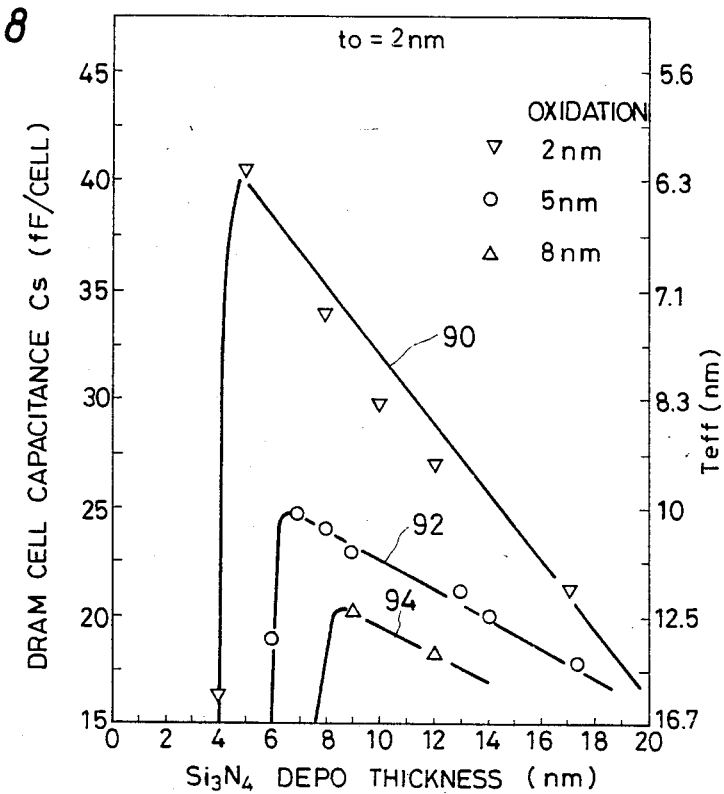
FIG. 8 illustrates the relationship between the silicon nitride layer thickness and effective thickness of the dielectric and the capacitance.

With reference to FIG. 8, curve 90 illustrates the capacitance versus the thickness of the silicon nitride film before oxidation when it has been oxidized to form a 2 nm silicon dioxide layer. It will be noted that when the initial thickness of the silicon nitride layer was less than about 4.2 nm, i.e. about 3 nm remaining after the oxidation, the capacitance drops dramatically. Analogously, curve 92 represents the capacitance versus silicon nitride layer thickness for a 5 nm silicon oxide layer. It will again be noted that when the remaining silicon nitride layer thickness after oxidation becomes reduced below about 3 nm, i.e. an initial thickness below about 6⅛ nm, the capacitance again drops dramatically. Similarly, curve 94 confirms that when the silicon nitride layer is oxidized to form an 8 nm layer of silicon dioxide, the capacitance again drops dramatically the remaining silicon nitride layer becomes less than 3 nm thick, i.e. an initial thickness of about 8 nm. Accordingly, the thickness of the initial silicon nitride layer and the step of oxidizing the silicon nitride layer are coordinated such that at least 3 nm of silicon nitride remain after the oxidation step.

Figure 9:
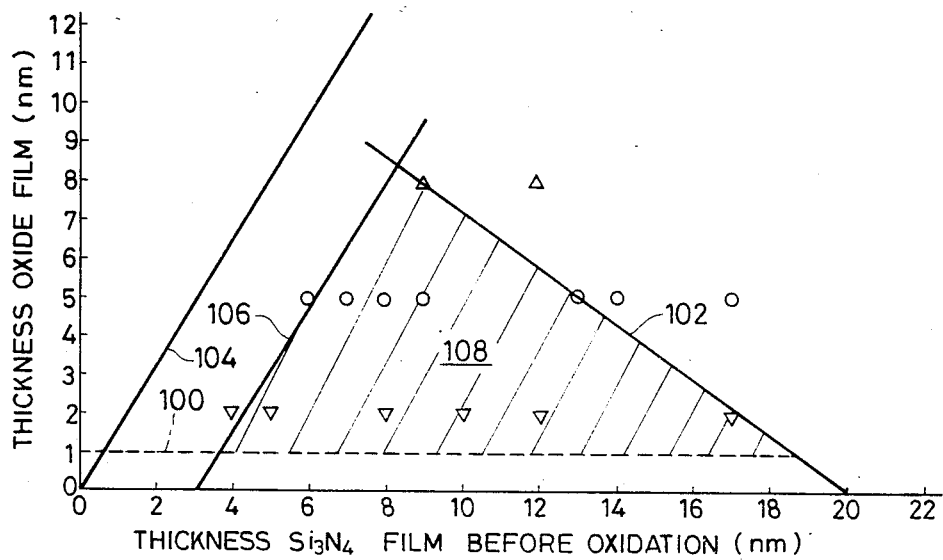
FIG. 9 is a diagram showing the range of thickness of a silicon oxide film versus thickness of a silicon nitride film for providing a practical level of reliability; and, FIG. 10 is a diagramatic illustration of accumulated defect ratio percentage versus time dependent dielectric breakdown (TDDB) life for silicon nitride films applied on natural oxide films of 1 to 3 nm.

With reference to FIG. 9, curve 100 represents a minimum silicon oxide layer thickness of 1 nm. As discussed above in conjunction with FIG. 5, a silicon dioxide layer thickness of 1 nm or more produces dramatically of more reliability and longer life expectancy. Curve 102 illustrates an effective thickness of 12 nm in accordance with FIG. 7. Line 104 represents the relationship between thickness of the nitride layer before it is oxidized and a thickness of the silicon dioxide layer 28. That is, oxidizing 1 nm of silicon nitride produces 1.6 nm of silicon dioxide. Curve 106 again illustrates the relationship between the silicon nitride before oxidation and the silicon dioxide layer after oxidation, but shifted such that 3 nm of silicon nitride remain after the oxidizing in accordance with FIG. 8. The region 108 bounded by curves 100, 102, and 106 marks the relationship between the initial silicon nitride layer thickness before oxidation which provide substantially better results.

Figure 10:
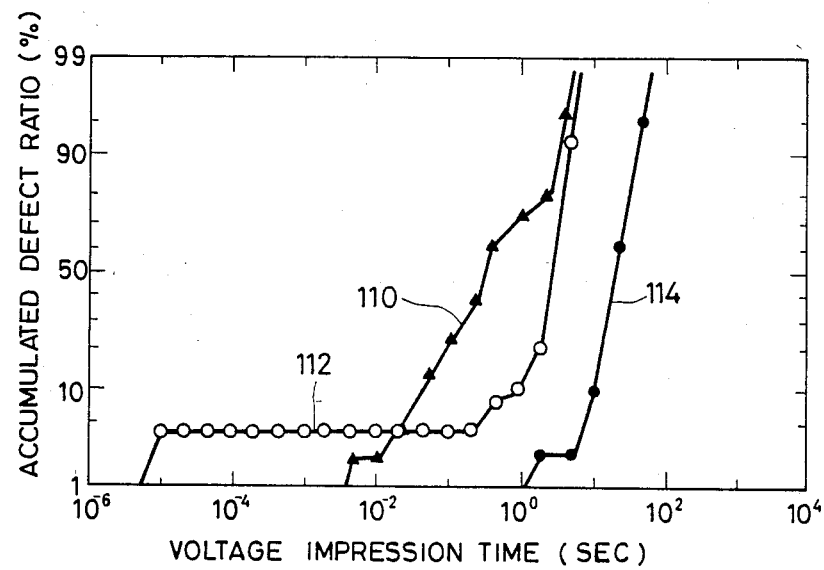

With reference to FIG. 10, because phosphorous or arsenic is normally doped into the polycrystalline silicon, an xide film naturally forms inside a chemical vapor deposition furnace before the silicon nitride layer is deposited. In the two-layered dielectric described above, it is preferable to reduce the thickness of the oxide film as much as possible. Curve 110 illustrates the relationship between the accumulated defect ratio and a time dependent dielectric breakdown when the natural oxidation film is 3 nm thick and the silicon nitride layer is 8 nm thick. Curve 112 illustrates the accumulated defect ratio to time dependent dielectric breakdown characteristics when the oxide film is 2 nm thick. For an oxide film that is 1 nm thick, as illustrated by curve 114, a significant increase in the reliability is achieved.

It is difficult to measure the thickness of the oxide film on polycrystalline silicon. Therefore, the oxide film thickness is calculated from the effective dielectric thickness $t_{eff}$ calculated from the thickness of the silicon nitride layer $t^d$SiN, the oxide film thickness $t_{SiO_2}$, and the capacitance for the dielectric constant of SiO$_2$. The capacitor of the multilayered dielectric is regarded as a series connection of the capacitance $C_{SiN}$ of the silicon nitride layer and the capacitance $C_{SiO2}$ of the oxide layer. The effective capacitance C is given below:

$$C = \frac{C_{SiN} C_{SiO2}}{C_{SiN} + C_{SiO2}}. \tag{1}$$

The capacitance C, the thickness t of the silicon nitride layer 26 and the silicon dioxide layer 28, and the dielectric constant E have the relation C=E/t. In view of the film decrease $\Delta t_{SiN} = t_{SiO2}/1.6$ due to oxidation of the silicon nitride, the formula (1) can be expressed in terms of thickness as follows:

$$t = \frac{E_{SiO2}}{E_{SiN}} \cdot t^{d}_{SiN} + \left(1 - \frac{E_{SiO2}}{1.6 E_{SiN}}\right) t_{SiO2}, \tag{2}$$

where
- $E_{SiO2}$ : Specific dielectric constant of silicon dioxide = 3.82
- $E_{SiN}$ : Specific dielectric constant of silicon nitride = 7.5.

Therefore, the difference between the effective dielectric thickness $t_{eff}$ determined from the actually measured value of the capacitance of the capacitor and the thickness t defined by the formula (2) is the thickness $t_o$ of the oxide film.

Namely, $$t_o = t_{eff} - t \tag{3}.$$

In the case of the extrapolation life $2 \times 10^{13}$ seconds of the capacitor of the multilayered dielectric in the preferred embodiment, the width of the distribution of the TDDB life must be at least 3 digits in order to satisfy the life 10 years ($3 \times 10^8$ seconds) of general electric components with a sufficient margin. Therefore, the values $t_{eff}$, $t_{SiN}^d$ and $t_{SiO2}$ are preferably selected in such a manner that the thickness of the oxide film $t_o$ is 2 nm or less, preferably 1 nm or less for the reasons discussed in conjunction with FIG. 10.

Embodiment 2

Figure 11:
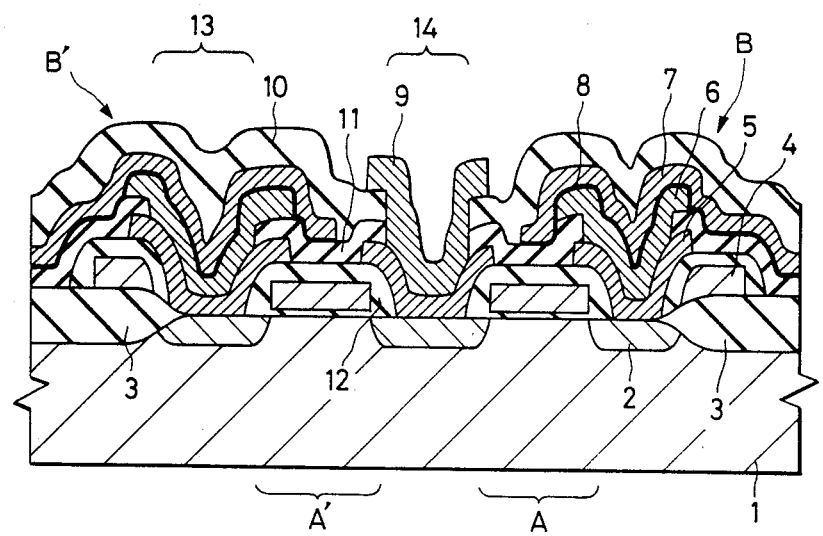
FIG. 11 is a schematic, sectional view of a dynamic random access memory cell of second embodiment.
Figure 12:
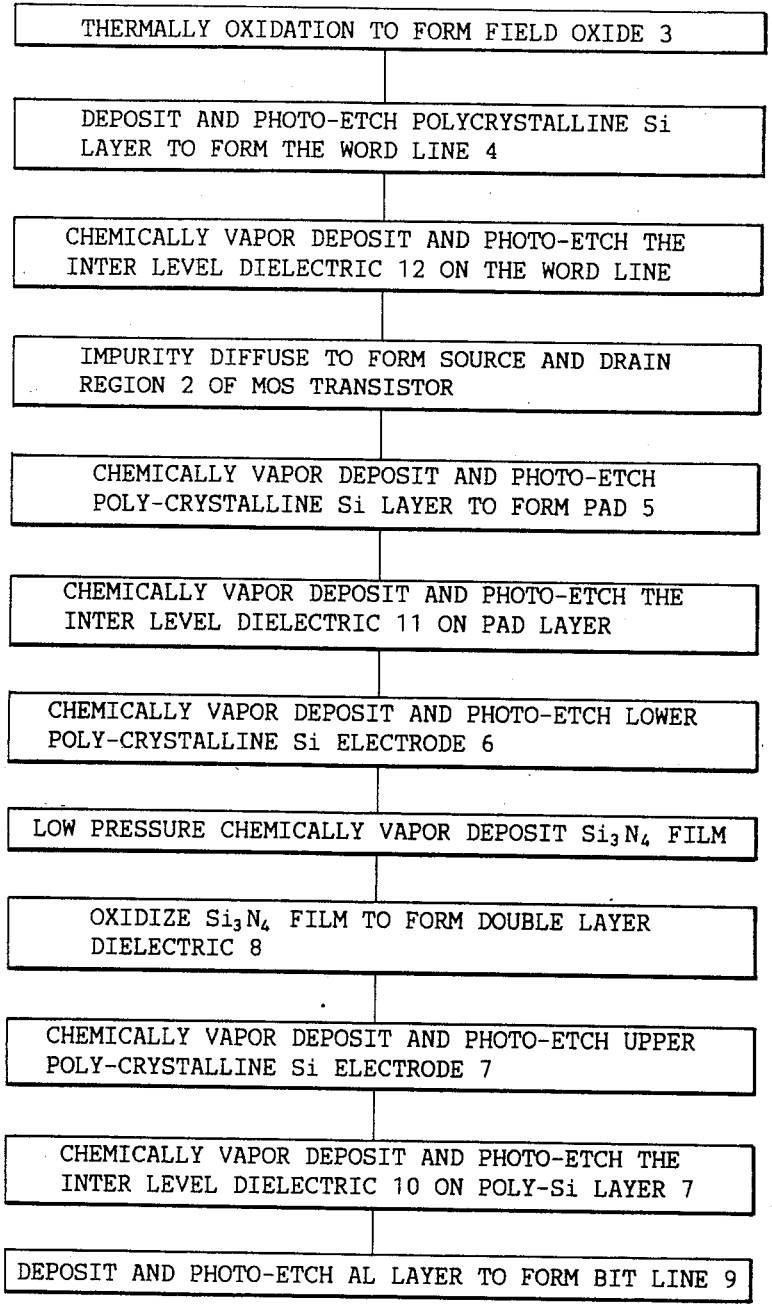
FIG. 12 is a diagramatic illustration of a method of fabricating the solid state device at FIG. 11.

The another embodiment is explained by FIG. 11, and 12. With reference to FIG. 11, a dynamic random access memory cell includes a MOS transistor A and a capacitor B connected to one of the terminals of the transistor and a dynamic random access memory cell includes a MOS transistor A' and a capacitor B' connected to one of the terminals of the transistor are commonly connected to bit line 9. The structure of this embodiment is explained with manufacturing proccess shown FIG. 12.

As shown process 101, a device isolation insulation film 3 is grown on the p-type silicon substrate by known LOCOS (Local oxidation of silicon) method. After forming gate insulation film 15, a polycrystalline silicon layer is grown by LPCVD (Low pressure chemical vaper deposition) with about 300 nm thickness. The polycrystalline silicon layer is defined by photo etching proccess to form a gate electrode 4 (word line) of the transistor A and A'.

In process 103, a inter layer insulation film 12 is formed by LPCVD method and Dry-etching method to cover the word lines.

In proccess 104, source and drain regions 2 of the MOS transisters are formed by Ion-implantation method. In proccess 105, a polycrystalline silicon layer is grown by LPCVD method, and defined by photo-etching proccess to form pad layer 5.

In process 105, a inter layer insulation film 11 is formed on the pad layer 5 by LPCVD method, and a contact hole 13 is formed by photoetching proccess 107 to connect the pad layer 5.

In process 108, a polycrystalline silicon layer 6 formed a lower electrode of the stacked capacitors B and B' is formed by LPCVD method and photo-etching proccess.

In process 109, a silicon nitride film ($Si_3N_4$) is formed on the polycrystalline silicon layer 6 by LPCVD method, then doble layer insulation film 8 is formed by thermal oxidation of the silicon nitride ($Si_3N_4$).

In proccess 110, plate electrodes 7 of capacitor B and B; of dynamic random access memory is formed by LPCVD method and photo-etching proccess.

In proccess 111, a inter layer insulation film 10 is formed by LPCVD method to cover the plate electrode 7, then a contact hole 14 is formed by photo-etching proccess to connect a bit line 9 and the pad layer. The aluminum (Al) bit line 9 is deposited by sputtering and defined by photo-etching method.

Finally, excuting other nessesary proccess, such as final passibation proccess, the dynamic random access memory is obtained.

According to this embodiment, capacitance of the capacitor B and B' are increased by a step of the pad layer 5 and inter layer insulation film 11. So this embodiment has some advantageous regarding reduction of memory cell area. And, a case of Dry-etching of the plate electrode 7, the silicon substrate 1 does not receive any damage because the silicon substrate is not exposed.

The invention has been described with reference to the preferred embodiments. Obviously, modifications and alterations will occur to those of ordinary skill in the art upon reading and understanding the preceding specification. It is intended that the invention be construed as including all such alterations and modifications insofar as they come in the scope in the appended claims or the equivalents thereof.

Having thus described the preferred embodiments, the invention is now claimed to be:

1. A capacitor integral with a solid state device manufactured with the process of:

forming a polycrystalline silicon layer with a first surface and a second surface, the first surface supported on a substrate and the second surface facing away from the substrate;

allowing a natural oxide film less than 2 nm thick to form and remain on the second surface of the polycrystalline silicon layer;

forming a layer of a silicon-nitrogen composition on the natural oxide film, the silicon-nitrogen composition layer being less than 18.6 nm thick and having a first face abutting the natural oxide layer and an exposed surface facing away from the natural oxide layer;

oxidizing the exposed surface of the silicon-nitrogen composition layer such that at least 3 nm of the silicon-nitrogen composition remains unoxidized adjacent the natural oxide film to protect the polycrystalline silicon layer from further oxidation; and, forming an electrode layer on the oxidized silicon-nitrogen composition layer exposed surface.

2. A capacitor integrally constructed with a semiconductor device, the capacitor comprising:
a substrate;
a lower electrode including a layer of polycrystalline silicon having a first surface abutting and supported on the substrate and a thin natural oxide film of less than 2 nm formed on a second surface thereof which second surface is parallel to the first surface and faces from the supporting substrate;
a multilayer dielectric including a layer of silicon-nitride disposed on the natural oxide film and a layer of silicon oxide, the silicon-nitride layer being between 3 nm and 18 nm thick and the silicon oxide layer being between 1 nm and 8½ nm thick; and,
an upper electrode mounted to the multilayer dielectric.

3. The capacitor as set forth in claim 2 wherein the oxidized polycrystalline silicon film is about 1 nm thick.

4. The capacitor as set forth in claim 2 wherein the silicon oxide layer is about 5 nm thick.

5. The capacitor as set forth in claim 2 wherein the substrate includes at least one region doped with an impurity and wherein the polycrystalline silicon layer first surface is electrically connected with the one region.

6. A solid state device comprising:
a doped substrate;
first and second doped regions supported by the substrate;
a gate insulated from and supported by the substrate between the first and second regions;
thick insulation film covering the gate and a portion of substrate adjacent the first region;
a polycrystalline silicon layer having a first surface supported by the first region and the thick insulation film and a second surface facing away from the substrate;
a natural oxide film on the second surface of the polycrystalline layer;
a first dielectric layer including a silicon-nitrogen composition deposited on the natural oxide film;
a second dielectric layer including a silicon-oxygen composition on the first dielectric layer;
the first dielectric layer having a thickness that is greater than:

$$3 \text{ nm} + \left(\frac{1}{1.6}\right)t_2$$

and less than $$(12 \text{ nm} - t_o)\frac{E_{SiN}}{E_{SiO}} - \left(\frac{E_{SiN}}{E_{SiO}} - \frac{1}{1.6}\right)t_2,$$

where $t_2$ is a thickness of the second dielectric layer, $t_o$ is a thickness of the natural oxide film $E_{SiN}$ is a dielectric constant of the silicon-nitrogen composition, and $E_{SiO}$ is a dielectric constant of the silicon-oxygen composition.

7. The solid state device as set forth in claim 6 wherein the oxide film is less than 2 nm thick and the second dielectric layer is at least 1 nm thick.

8. The solid state device as set forth in claim 7 wherein the silicon-nitrogen composition is $Si_3N_4$ and the silicon oxygen composition is $SiO_2$.

9. A capacitor integrally constructed with an MOS transistor comprising:
a doped substrate in which two regions doped with an n-type impurity are defined;
a gate surrounded by an insulator and supported by the substrate between the two regions;
a first polycrystalline silicon electrode with a natural oxide less than 1 nm thick on one surface thereof, the polycrystalline electrode having another surface in electrical communication with one of the regions and extending at least partially along the gate insulation, the first polycrystalline silicon electrode being supported by the one region and the gate electrode insulation;
a multilayer dielectric including a layer of silicon-nitride disposed on the natural oxide and a layer of silicon oxide, the silicon-nitride layer being between 3 nm and 18 nm thick and the silicon oxide layer being between 1 nm and 8½ nm thick; and,
a second electrode mounted to the multilayer dielectric.

10. A solid state device comprising:
a substrate;
a polycrystalline silicon layer having a first surface supported by the substrate and a second surface facing away from the substrate;
a natural oxide film less than 2 nm thick on the second surface of the polycrystalline silicon layer;
a silicon-nitrogen composition layer disposed on the oxide film and supported by the polycrystalline silicon layer;
a silicon-oxygen composition layer disposed on and supported by the first dielectric layer;
the first dielectric layer having a thickness that is greater than:

$$3 \text{ nm} + \left(\frac{1}{1.6}\right)t_2$$

and less than $$(12 \text{ nm} - t_o)\frac{E_{SiN}}{E_{SiO}} - \left(\frac{E_{SiN}}{E_{SiO}} - \frac{1}{1.6}\right)t_2$$

where $t_2$ is a thickness of the second dielectric layer, $t_o$ is a thickness of the natural oxide film, $E_{SiN}$ is a dielectric constant of the silicon-nitrogen composition, and $E_{SiO}$ is a dielectric constant of the silicon-oxygen composition.

* * * * *